United States Patent
Tzemah et al.

(10) Patent No.: US 10,895,813 B2
(45) Date of Patent: Jan. 19, 2021

(54) LITHOGRAPHIC CLUSTER, LITHOGRAPHIC APPARATUS, AND DEVICE MANUFACTURING METHOD

(71) Applicant: ASML Holding N.V., Veldhoven (NL)

(72) Inventors: Irit Tzemah, Norwalk, CT (US); Eric Brian Catey, Danbury, CT (US); John David Connelly, Stratford, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/760,137

(22) PCT Filed: Oct. 26, 2018

(86) PCT No.: PCT/EP2018/079364
§ 371 (c)(1),
(2) Date: Apr. 29, 2020

(87) PCT Pub. No.: WO2019/086334
PCT Pub. Date: May 9, 2019

(65) Prior Publication Data
US 2020/0326640 A1 Oct. 15, 2020

Related U.S. Application Data

(60) Provisional application No. 62/580,095, filed on Nov. 1, 2017.

(51) Int. Cl.
*G03F 7/20* (2006.01)
*G03F 9/00* (2006.01)

(52) U.S. Cl.
CPC ........ *G03F 7/70633* (2013.01); *G03F 9/7073* (2013.01)

(58) Field of Classification Search
CPC .............. G03F 9/7019; G03F 7/70516; G03F 7/70525; G03F 7/70425; G03F 9/7073;
(Continued)

(56) References Cited

U.S. PATENT DOCUMENTS 5,989,762 A * 11/1999 Takaoka .................. G03F 9/70
430/30
6,297,876 B1   10/2001 Bornebroek
(Continued)

FOREIGN PATENT DOCUMENTS

CN       106328585 A     1/2017
EP       1 843 210 A2   10/2007
(Continued)

OTHER PUBLICATIONS

International Search Report and Written Opinion of the International Searching Authority directed to related International Patent Application No. PCT/EP2018/079364, dated Feb. 5, 2019; 10 pages.
(Continued)

*Primary Examiner* — Steven Whitesell Gordon
(74) *Attorney, Agent, or Firm* — Sterne, Kessler, Goldstein & Fox P.L.L.C.

(57) ABSTRACT

A lithographic cluster includes a track unit and a lithographic apparatus. The lithographic apparatus includes an alignment sensor and at least one controller. The track unit is configured to process a first lot and a second lot. The lithographic apparatus is operatively coupled to the track unit. The alignment sensor is configured to measure an alignment of at least one alignment mark type of a calibration wafer. At least one controller is configured to determine a correction set for calibrating the lithographic apparatus based on the measured alignment of the at least one alignment mark type and apply first and second weight corrections to the correction set for processing the first and second lots, respectively, such that overlay drifts or jumps during processing the first and second lots are mitigated.

15 Claims, 6 Drawing Sheets

(58) Field of Classification Search
CPC ... G03F 7/70633; G03F 7/70991; H01L 22/20
See application file for complete search history.

(56) References Cited

U.S. PATENT DOCUMENTS

| | | |
|---|---|---|
| 6,961,116 B2 | 11/2005 | Den Boef et al. |
| 8,767,183 B2 | 7/2014 | Den Boef |
| 9,672,320 B2 | 6/2017 | Chang et al. |
| 10,558,130 B2 | 2/2020 | Queens et al. |
| 2002/0012861 A1 | 1/2002 | Luhn et al. |
| 2003/0074639 A1* | 4/2003 | Park .................. G03F 7/70633 430/22 |
| 2010/0030360 A1 | 2/2010 | Habets et al. |
| 2014/0212817 A1* | 7/2014 | Habets .................. G05B 17/02 430/319 |
| 2018/0011398 A1 | 1/2018 | Tel et al. |

FOREIGN PATENT DOCUMENTS

| | | |
|---|---|---|
| TW | 201629617 A | 8/2016 |
| TW | 201712439 A | 4/2017 |
| WO | WO 2017/108453 A1 | 6/2017 |

OTHER PUBLICATIONS

International Preliminary Report on Patentability directed to related International Patent Application No. PCT/EP2018/079364, dated May 5, 2020; 7 pages.
"Improved algorithm for scanner drift control," Research Disclosure No. 641039, Aug. 8, 2017; 4 pages.

\* cited by examiner

LITHOGRAPHIC CLUSTER, LITHOGRAPHIC APPARATUS, AND DEVICE MANUFACTURING METHOD

CROSS-REFERENCE TO RELATED APPLICATIONS

This application claims priority of U.S. Provisional Patent Application No. 62/580,095, which was filed on Nov. 1, 2017, and which is incorporated herein in its entirety by reference.

FIELD

The present disclosure relates to lithography apparatuses and systems, including for example, lithographic cluster apparatuses and systems

BACKGROUND

A lithography apparatus is a machine that applies a desired pattern onto a target portion of a substrate. A lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of one or several dies) on a substrate (e.g., a silicon wafer) that has a layer of radiation-sensitive material (resist). In general, a single substrate will contain a network of adjacent target portions that are successively exposed. Known lithography apparatuses include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

To monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated alignment mark. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a mark on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties.

Drift of the lithographic process can occur over time. Drift can be caused by mark alignment, stage alignment, or some combination thereof. When the accuracy of an alignment position is diminished, an overlay impact can be seen and measured. Accurate and consistent alignment improves overlay, and lot streaming improves overall productivity.

One method of improving accuracy is to fabricate a fiducial, that is, a reference mark, and position the beam relative to the fiducial. Drift of an alignment module can be measured on fiducials of a patterned mark of the product substrate or the dedicated alignment mark. Corrections can then be applied to standard reference marks of the product substrate or alignment mark. Calibration is done with these calibration structures, with the intention that the calibration will remain valid for measurements on various application structures.

However, calibration operations to reduce drift prior to exposure by the lithography apparatus can be time consuming and reduce throughput. Advanced alignment models can model and correct alignment positions, but cause significant overhead due to the increased number of marks needed to meet the overlay and drift reduction requirements. Additionally, serious delays can occur if a critical dimension or layer fails (e.g., is outside a threshold value). Further, applying an offset to a standard reference mark can cause overlay drifts or jumps. Overlay drifts or jumps can lead to reworking of product substrate layers and significant processing delays.

Accordingly, there is a need in a lithographic cluster to improve alignment accuracy during lot streaming in order to mitigate overlay drifts or jumps, prevent reworking of substrate layers, avoid time loss delays, and reduce lot overhead (LOH) to increase system throughput and productivity.

SUMMARY

In some embodiments, a lithographic cluster includes a track unit and a lithographic apparatus. In some embodiments, the lithographic apparatus includes an alignment sensor and at least one controller. In some embodiments, the track unit is configured to process a first lot which includes a first plurality of wafers and a second lot which includes a second plurality of wafers. In some embodiments, the lithographic apparatus is operatively coupled to the track unit. In some embodiments, the alignment sensor is configured to measure an alignment of at least one alignment mark type of a calibration wafer. In some embodiments, at least one controller is configured to determine a correction set for calibrating the lithographic apparatus based on the measured alignment of the at least one alignment mark type. In some embodiments, at least one controller is configured to apply a first weight correction to the correction set for processing the first lot. In some embodiments, at least one controller is configured to apply a second weight correction to the correction set for processing the second lot. In some embodiments, the second weight correction is greater than or equal to the first weight correction. In some embodiments, overlay drifts or jumps for processing the first and second lots are mitigated.

In some embodiments, the track unit is further configured to stream and process the calibration wafer. In some embodiments, the calibration wafer is an etched and non-coated wafer. In some embodiments, the calibration wafer is coated.

In some embodiments, the lithographic apparatus includes the alignment sensor.

In some embodiments, the lithographic apparatus further includes an inspection apparatus.

In some embodiments, the lithographic apparatus includes the inspection apparatus. In some embodiments, the track unit includes the inspection apparatus.

In some embodiments, the at least one controller includes a first controller configured to determine the correction set and a second controller configured to control at least one of the alignment sensor and one of the track unit and the lithographic apparatus. In some embodiments, the at least one controller includes a controller configured to determine the correction set and to control at least one of the alignment sensor and to control at least one of the track unit and the lithographic apparatus.

In some embodiments, the first lot and the second lot are processed in real time. In some embodiments, wherein the track unit and the lithographic apparatus are configured to stream the first lot and the second lot such that a start time for processing the second lot occurs before a finish time for processing the first lot. In some embodiments, the alignment sensor measures the alignment of the at least one alignment mark type of the calibration wafer while the calibration wafer is streamed before the first lot and the second lot.

In some embodiments, at least one alignment mark type of the calibration wafer includes a bidirectional fine wafer alignment (BF) mark. In some embodiments, at least one alignment mark type of the calibration wafer includes a symmetrical fine wafer alignment (SF) mark.

In some embodiments, applying the first weight correction and applying the second weight correction each includes implementing an application specific correction (ASC), dynamic application specific correction (ASC2), application process correction (APC), internal APC loop, or some combination thereof.

In some embodiments, a first weight correction is about 0% to 100%, and a second weight correction is about 0% to 100%. In some embodiments, the first weight correction and the second weight correction can each be about 15% to 75%. In some embodiments, the second weight correction is greater than or equal to the first weight correction.

In some embodiments, the correction set includes, for example, a recipe, a layer, a mark type, a scan speed, a field layout, a plurality of mark locations, an aligned position, or some combination thereof. An inspection apparatus can measure a first overlay impact of the first weight correction in parallel. In some embodiments, the inspection apparatus can be external to the lithographic apparatus and check overlay impact in parallel to the alignment sensor measuring alignment accuracy.

In some embodiments, the lithographic cluster is configured to reduce LOH by streaming calibration. For example, an alignment sensor can calibrate mark type offsets of a streamed calibration wafer to determine a correction set. For example, a weight correction can be applied as an alignment position offset to the alignment sensor measurements to mitigate overlay drifts or jumps during lot streaming to improve productivity and reduce LOH.

In some embodiments, a method for mitigating overlay drifts or jumps in a lithographic cluster includes measuring, using an alignment sensor, an alignment of at least one alignment mark type of a calibration wafer. In some embodiments, the method includes determining, using at least one controller, a correction set based on the measured alignment of the at least one alignment mark type. In some embodiments, the method includes processing, using a lithographic apparatus, a first lot which includes a first plurality of wafers by applying a first weight correction to the correction set, and a second lot which includes a second plurality of wafers by applying a second weight correction to the correction set.

In some embodiments, the processing includes streaming the first lot and the second lot such that a start time of the second lot occurs before a finish time of the first lot. In some embodiments, the processing occurs in real time. In some embodiments, the method for mitigating overlay drifts or jumps in a lithographic cluster further includes streaming the calibration wafer before the first lot and the second lot, such that a start time of processing the first lot occurs after the correction set based on the measured alignment of the calibration wafer is determined. In some embodiments, the at least one alignment mark type of the calibration wafer includes a bidirectional fine wafer alignment (BF) mark, a symmetrical fine wafer alignment (SF) mark, a custom mark, or some combination thereof. In some embodiments, the second weight correction is equal to or greater than the first weight correction.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
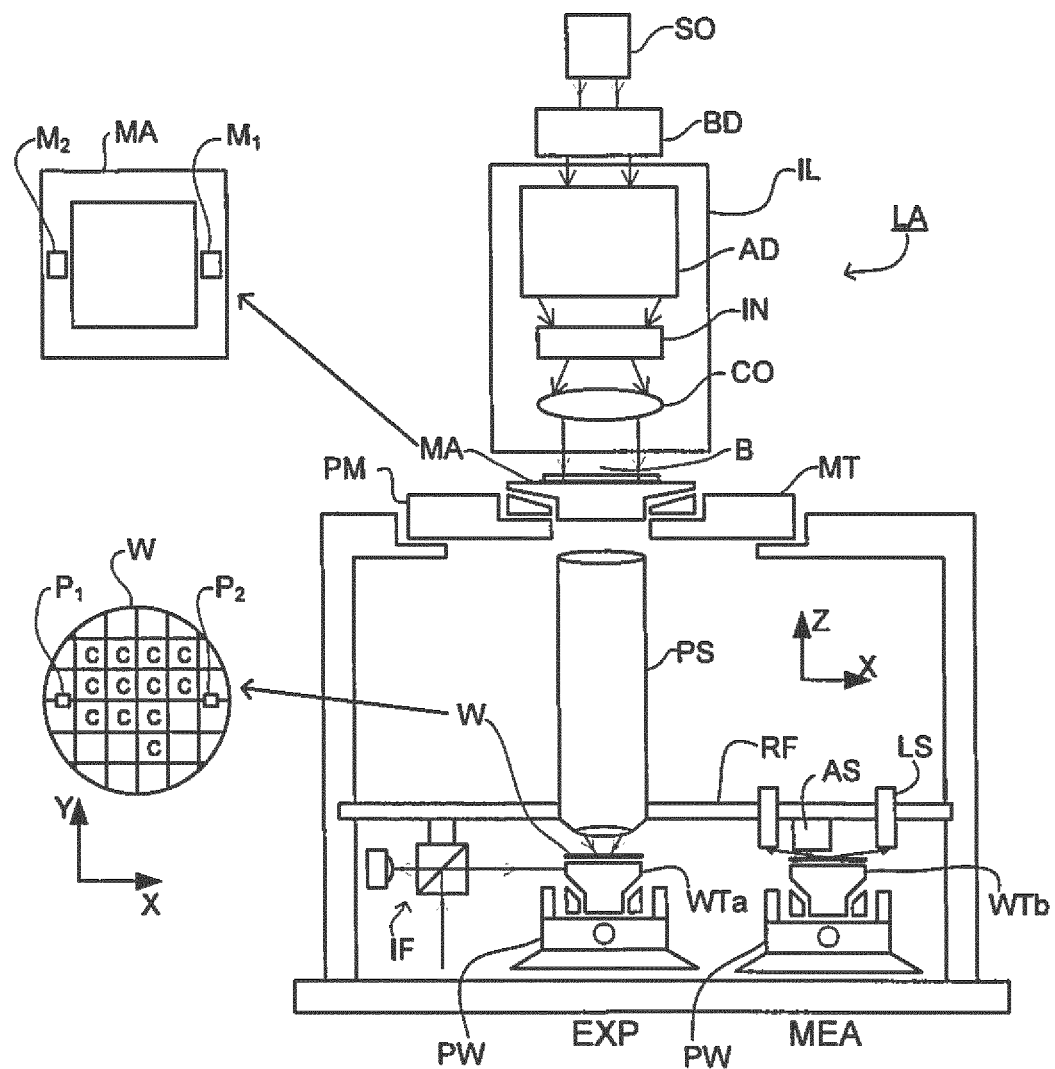
FIG. 1 depicts a lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing embodiments in detail, it is instructive to present an example environment in which embodiments of the present invention may be implemented.

FIG. 1 schematically depicts a lithographic apparatus LA. The apparatus includes an illumination system (illuminator) IL configured to condition a radiation beam B (e.g., UV radiation or DUV or EUV radiation), a patterning device support or support structure (e.g., a mask table) MT constructed to support a patterning device (e.g., a mask) MA and connected to a mask positioner PM configured to accurately position the patterning device in accordance with certain parameters; first and second substrate tables (e.g., a wafer table) WTa and WTb, respectively, each constructed to hold a substrate (e.g., a resist coated wafer) W and each connected to a substrate positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic, or other types of optical components, or any combination thereof, for directing, shaping, or controlling radiation.

The patterning device support MT holds the patterning device MA in a manner that depends on the orientation of the patterning device MA, the design of the lithographic apparatus LA, and other conditions, such as for example whether or not the patterning device MA is held in a vacuum environment. The patterning device support MT can use mechanical, vacuum, electrostatic or other clamping techniques to hold the patterning device MA. The patterning device support MT may be a frame or a table, for example, which may be fixed or movable as required. The patterning device support MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable liquid-crystal display (LCD) panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam B from a radiation source SO. The radiation source SO and the lithographic apparatus LA may be separate entities, for example, when the radiation source SO is an excimer laser. In such cases, the radiation source SO is not considered to form part of the lithographic apparatus LA and the radiation beam B is passed from the source SO to the illuminator IL with the aid of a beam delivery system BD including, for example, suitable directing mirrors and/or a beam expander. In other cases, the radiation source SO may be an integral part of the lithographic apparatus LA, for example, when the radiation source SO is a mercury lamp. The radiation source SO and the illuminator IL, together with the beam delivery system BD if required, may be referred to as a radiation system.

The illuminator IL may for example include an adjuster AD for adjusting the angular intensity distribution of the radiation beam B, an integrator IN and a condenser CO. The illuminator IL may be used to condition the radiation beam B, to have a desired uniformity and intensity distribution in its cross section.

The radiation beam B is incident on the patterning device MA, which is held on the patterning device support MT, and is patterned by the patterning device MA. Having traversed the patterning device (e.g., mask) MA, the radiation beam B passes through the projection system PS, which focuses the beam onto a target portion C of the substrate W. With the aid of the substrate positioner PW and position sensor IF (e.g., an interferometric device, linear encoder, 2-D encoder, capacitive sensor, etc.), the first substrate table WTa or the second substrate table WTb can be moved accurately, e.g., so as to position different target portions C in the path of the radiation beam B. Similarly, the mask positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks M1, M2 may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the first substrate table WTa are scanned synchronously while a pattern imparted to the radiation beam is projected onto a target portion C (i.e., a single dynamic exposure). The speed and direction of the first substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatuses and modes of operation are possible, as is well-known in the art. For example, a step mode is known. In so-called "maskless" lithography, a programmable patterning device is held stationary but with a changing pattern, and the first substrate table WTa is moved or scanned.

Combinations and/or variations on the above described modes of use or entirely different modes of use may also be employed.

Lithographic apparatus LA is of a so-called dual stage type which has two substrate tables, first substrate table WTa and second substrate table WTb, and two stations—an exposure station EXP and a measurement station MEA—between which the substrate tables WTa, WTb can be exchanged. While one substrate on one substrate table is being exposed at the exposure station EXP, another substrate can be loaded onto the other substrate table at the measurement station MEA and various preparatory steps carried out. This enables a substantial increase in the throughput of the apparatus. The preparatory steps may include mapping the surface height contours of the substrate using a level sensor LS and measuring the position of substrate alignment markers P1, P2 using an alignment sensor AS. If the position sensor IF is not capable of measuring the position of the substrate table WTa or WTb while it is at the measurement station MEA as well as at the exposure station EXP, a second position sensor may be provided to enable the positions of the substrate table WTa or WTb to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
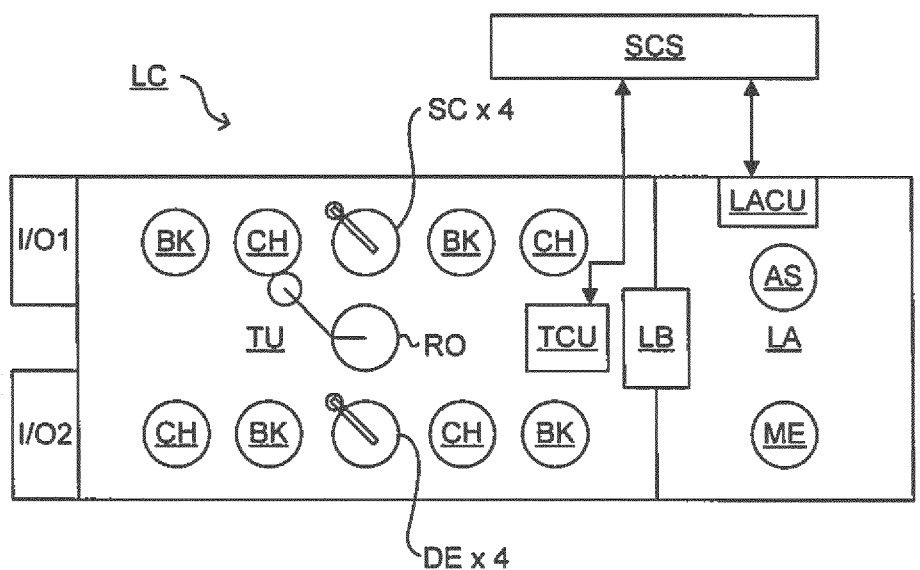
FIG. 2 depicts a lithographic cluster having a lithographic apparatus, according to some embodiments.

As shown in FIG. 2, the lithographic apparatus LA forms part of a lithographic cluster LC, sometimes referred to as a lithocell, which also includes one or more apparatuses to perform pre- and post-exposure processes on substrates. These pre- and post-exposure process apparatuses can include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatus and delivers the substrate to the loading bay LB of lithographic apparatus LA. These pre- and post-exposure process apparatuses and substrate handler RO, which are collectively referred to as a track unit TU, are under the control of a track control unit TCU that is itself controlled by a supervisory control system SCS, which also controls the lithographic apparatus LA via a lithographic apparatus control unit LACU. That is, the supervisory control system SCS operationally couples track unit TU to lithographic apparatus LA. Thus, the different apparatuses can be operated to maximize throughput and processing efficiency.

The substrates processed by the track unit TU are then transferred to other processing tools for etching and other chemical or physical treatments within the device manufacturing process. In some instances, metrology may be performed on substrates after such etching or chemical/physical treatment steps. For example, as shown in FIG. 2, lithographic apparatus LA can include an alignment sensor AS and an inspection apparatus ME. In other embodiments, inspection apparatus ME is part of track unit TU, or separate from both track unit TU and lithographic apparatus LA. Inspection apparatus ME can be a box-in-box or frame-in-frame measuring apparatus, a scanning electron microscope (SEM), and/or a scatterometer for measuring overlay.

The lithographic apparatus control unit LACU controls all the movements and measurements of the various actuators and sensors described. LACU also includes signal processing and data processing capacity to implement desired calculations relevant to the operation of the lithographic cluster LC. In the terminology of the introduction and claims, the combination of these processing and control functions referred to simply as the "controller". In practice, control unit LACU will be realized as a system of many sub-units, each handling the real-time data acquisition, processing, and control of a subsystem or component within the lithographic cluster LC. For example, the controller can adjust the alignment positions of the substrate positioner PW and/or mask positioner PM based on a calibrated alignment or alignment offset (e.g., mark type offset, diffraction order offset, wavelength offset, etc.) of substrate alignment marks P1, P2 or custom alignment marks detected by the alignment sensor AS and/or level sensor LS. Further, for example, one processing subsystem may be dedicated to servo control of the substrate positioner PW. Separate units may even handle coarse and fine actuators, or different axes. Another unit might be dedicated to the readout of the position sensor IF. Overall control of the lithographic cluster LC may be controlled by the supervisory control system SCS, communicating with these sub-systems processing units, with operators, and with other apparatuses involved in the lithographic manufacturing process. In some cases, the supervisory control system SCS includes a central processing unit (CPU).

In some embodiments, lithographic cluster LC is configured to reduce lot overhead (which is described further below), and mitigate overlay drifts or jumps that occur over time during process fabrication of a plurality of lots, each including a plurality of substrates (e.g., 5, 10, 15, 20, 25 wafers, etc.), by calibrating alignment offsets (e.g., position offset, mark type offset, diffraction order offset, wavelength offset, etc.) of alignment mark types 318 on a calibration wafer 300 before processing a first lot, and applying, in real time, a weight correction to the first lot and subsequently processed lots based on the calibrated alignment offsets.

Figure 3:
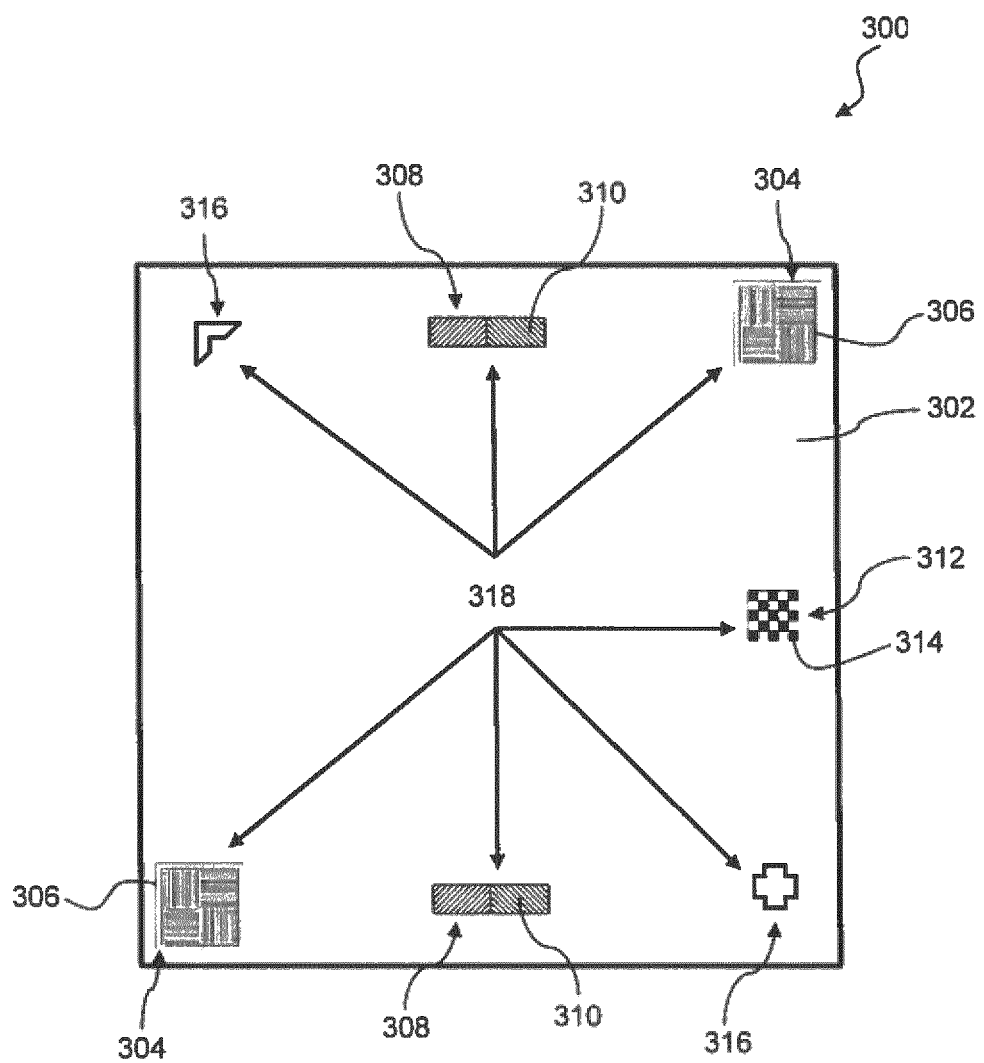
FIG. 3 depicts a schematic diagram of a calibration wafer, according to some embodiments.

FIG. 3 depicts calibration wafer 300, according to an embodiment. Calibration wafer 300 can include an etched substrate 302, non-coated or coated, having one or more alignment mark types 318. In some embodiments, calibration wafer 300 is a mark type offset calibration (MTOC) wafer having alignment mark types 318 that are configured (i.e., designed and arranged) to facilitate measurement of alignment. As shown in FIG. 3, alignment mark types 318 can include one or more different types of alignment marks, including standard reference marks 304, bidirectional fine wafer alignment (BF) marks 308, symmetrical fine wafer alignment (SF) marks 312, custom marks 316, or some combination thereof. As shown in FIG. 3, for example, standard reference marks 304 can include an extended pattern area (XPA) mark 306. XPA mark 306 is an alignment mark or standard reference mark, and includes four groups of parallel alignment lines in a square in four separate quadrants, with a first set arranged in a vertical direction and a second set arranged in a horizontal direction. The first and second sets of alignment lines are alternatively arranged to form a square and achieve alignment in the vertical and horizontal directions, respectively, such that the horizontal direction is perpendicular to the vertical direction. As shown in FIG. 3, for example, BF marks 308 can include a bidirectional line mark 310. Bidirectional line mark 310 is a mirror symmetric mark, and includes a first set of alternating parallel lines angled at 45° and a second set of alternating parallel lines angled at −45° with respect to the longitudinal axis. As shown in FIG. 3, for example, SF marks 312 can include a checkerboard mark 314. Checkerboard mark 314 is a 180° symmetric mark, and includes a plurality of two types of optically different squares differentiated by pattern, reflectance (amplitude and/or phase), or some combination thereof. When rotated 180° about an axis perpendicular to the plane, checkerboard mark 314 is substantially identical and symmetrical. In some embodiments, different alignment mark patterns can be used for SF marks 312 as long as the alignment mark patterns exhibit 180° symmetry. For example, SF marks 312 can include parallel lines, horizontal lines, a grid pattern, or a checkerboard grating. Although the illustrated calibration wafer 300 includes a standard reference mark 304, a BF mark 308, a SF mark 312, and a custom mark 316, calibration wafer 300 may include a subset of one or more of these marks.

In some embodiments, calibration wafer 300 can be a customized calibration wafer. For example, calibration wafer 300 can be designed by a purchaser or user of lithographic cluster LC. In some embodiments, calibration wafer 300 can be a standardized calibration wafer designed by the manufacturer of the components of the lithographic cluster LC.

Figure 4A:
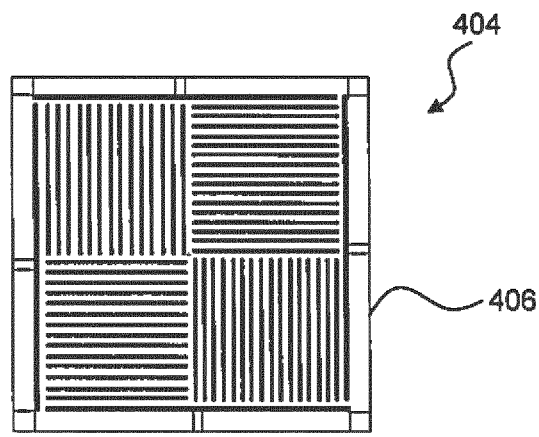
FIGS. 4A-4C depict plan views of different alignment mark types, according to some embodiments.
Figure 4B:
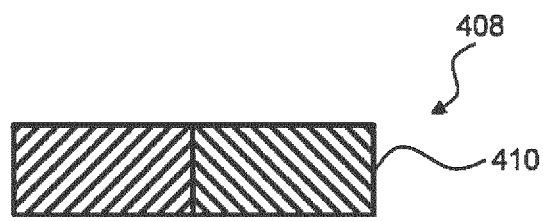
Figure 4C:
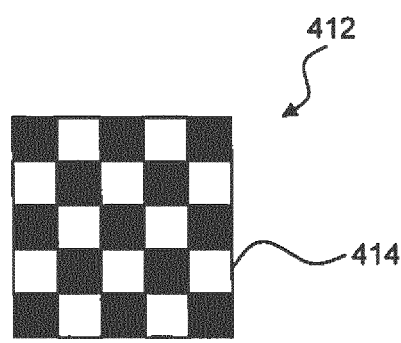

FIGS. 4A-4C depict enlarged plan views of various embodiments of alignment mark types 318 of calibration wafer 300, as shown in FIG. 3. FIG. 4A illustrates one embodiment of a standard reference mark 404. For example, standard reference mark 404 can be an XPA mark 406, as described above regarding XPA mark 306 in FIG. 3. FIG. 4B illustrates one embodiment of a BF mark 408. As shown in FIG. 4B, for example, BF mark 408 can be a bidirectional line mark 410, as described above regarding BF mark 408 in FIG. 3. FIG. 4C illustrates one embodiment of a SF mark 412. As shown in FIG. 4C, for example, SF mark 412 can be a checkerboard mark 414, as described above regarding SF mark 412 in FIG. 3.

Lithographic cluster LC can be configured to calibrate one or more alignment mark types 318, including BF marks 308, SF marks 312, and custom marks 316. For example, alignment sensor AS can measure and calibrate one or more alignment mark types 318. The alignment sensor AS calibration can be an alignment or an alignment offset of one or more alignment mark types 318 on calibration wafer 300. In some embodiments, alignment sensor AS can be an interferometric sensor, a dose sensor, a transmission image sensor, an alignment sensor, a level sensor, or some combination thereof. For example, alignment sensor AS can be a SMASH (SMart Alignment Sensor Hybrid) sensor; a self-referencing interferometer used for alignment with a symmetrical or SF mark 312, which is described in U.S. Pat. Nos. 8,767,183 and 6,961,116, which are incorporated by reference; or an ATHENA (Advanced Technology using High order Enhancement of Alignment) sensor, which is described in U.S. Pat. Nos. 8,767,183 and 6,297,876, which are incorporated by reference. In some embodiments, alignment sensor AS can be an image rotation interferometric sensor that can measure alignment of SF marks 312. For example, the image rotation interferometric sensor can produce two images of each SF mark 312, rotate the images 180° with respect to each other, and recombine the images interferometrically to observe constructive or destructive interference and determine if the alignment sensor AS is centered on SF mark 312. In some embodiments, lithographic apparatus LA includes one or more alignment sensors AS. In some embodiments, calibrations of alignment sensor AS can be based on a user's custom alignment and wafer measurements.

In some embodiments, alignment of one or more alignment mark types 318 of calibration wafer 300 can be measured by alignment sensor AS, and one or more controllers of lithographic cluster LC (e.g., one or more of controllers including supervisory control system SCS, lithographic apparatus control unit LACU, alignment sensor AS, and track control unit TCU) can determine a correction set that calibrates lithographic cluster LC based on the offset measurement of the one or more alignment mark types 318. The correction set can include one or more of the following data: a recipe, a layer, a mark type, a scan speed, a field layout, a plurality of mark locations, an aligned position, or some combination thereof. The correction set for each wafer of each lot is stored in a memory of lithographic cluster LC, for example, in a memory of lithographic apparatus LA, in a memory of alignment sensor AS, in a memory of lithographic apparatus LA operatively coupled to controller LACU, in a memory of alignment sensor AS operatively coupled to lithographic apparatus LA and/or lithographic apparatus control unit LACU, or some combination thereof. In some embodiments, each correction set has a time stamp. In some embodiments, if a certain number of correction sets is exceeded, the oldest stored correction set can be automatically deleted, for example, by an engineering data interface (EDI) utilizing an extensible markup language (XML) schema to move data from the device level in real time. In some embodiments, a user can delete correction sets manually. In some embodiments, real time corrections of each correction set for each wafer of each lot are based on calibrations of mark type offset alignment marks by alignment sensor AS. In some embodiments, XPA marks 306 are measured during calibration of mark type offsets and serve as standard reference marks 304 for all other types of measured marks (e.g., BF marks 308, SF marks 312, custom marks 316, etc.) by alignment sensor AS.

After determining the correction set based on the measured alignment or alignment offset (e.g., position offset, mark type offset, diffraction order offset, wavelength offset, etc.) of one or more alignment mark types 318 of calibration wafer 300 by alignment sensor AS, a calibrated alignment or alignment offset is stored in a memory of alignment sensor AS and/or lithographic apparatus LA, for example, in lithographic apparatus control unit LACU. A weight correction is then applied by lithographic cluster LC (e.g., by the supervisory control system SCS, lithographic apparatus control unit LACU, lithographic apparatus LA, and/or alignment sensor AS) to one or more parameters of the correction set. For example, a weight correction can be applied to the aligned position in the correction set. In some embodiments, a weight correction can be applied as an alignment offset to the measurements of alignment sensor AS. For example, mark type offsets, including alignment position offsets, can be stored as constants and used as a given offset for each alignment mark, each type of alignment mark, diffraction order, wavelength, or some combination thereof. In some embodiments, correction sets are increasingly weighted for each lot subsequently processed by lithographic cluster LC. In some embodiments, the weight correction can be executed through in-situ monitoring and/or a feedback/feedforward loop(s), for example, an application specific correction (ASC), a dynamic application specific correction (ASC2), an application process correction (APC), an internal APC loop (iAPC), or some combination thereof. ASC, ASC2, APC, and iAPC are different monitoring and feedback systems and methods that can improve process or specific corrections, for example, applying a weight correction to an alignment position offset measured by the alignment sensor AS. For example, APC can trigger substrate positioner PW to compensate for a correction set parameter if that parameter is determined to be outside of a predetermined tolerance.

In some embodiments, at least one controller controls processing of a lot based on a weight correction determined from an adjusted correction set. For example, at least one controller controls processing a first lot based on a first weight correction determined from a first adjusted correction set. For example, at least one controller controls processing a second lot based on a second weight correction determined from a second adjusted correction set.

In some embodiments, drift is reduced or prevented without the use of a look-ahead (LAHD) lot program. For example, overlay drift or jump can be mitigated by applying one or more alignment offsets measured and calibrated by alignment sensor AS for each alignment mark type 318 while lots are streamed or in real time processing without any LAHD lot programs (e.g., LAHD predictions, extensive feedback, etc.).

Figure 5:
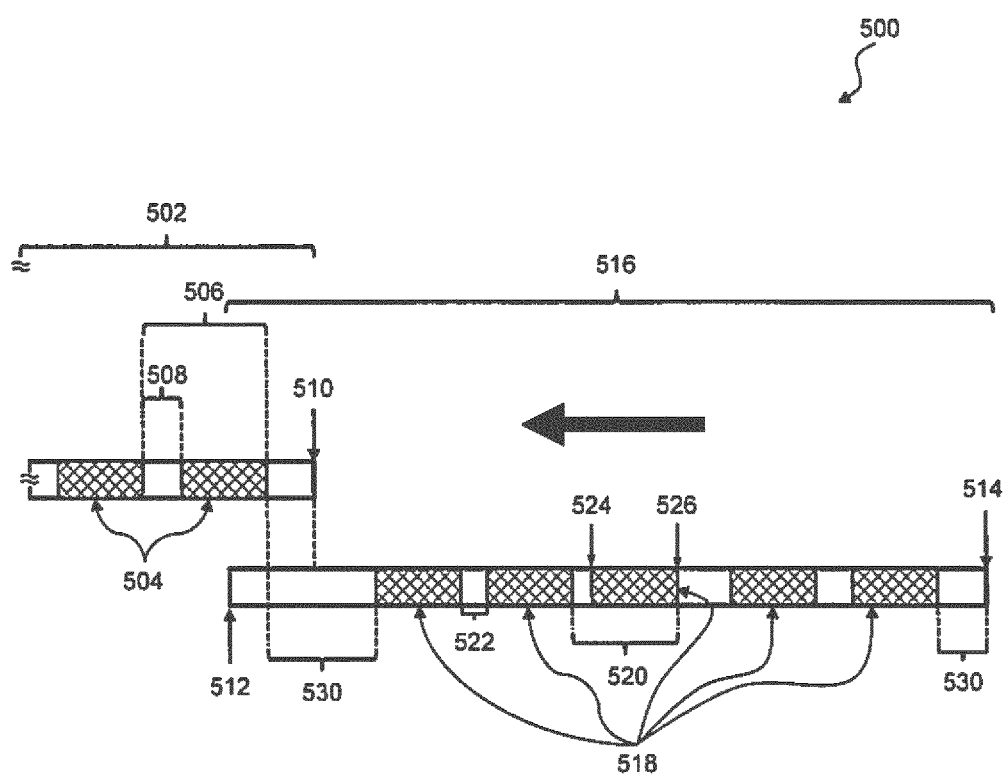
FIG. 5 depicts a schematic diagram of a wafer processing flow of the lithographic cluster in streaming mode, according to some embodiments.

FIG. 5 schematically depicts an exemplary lot processing flow or streaming mode 500 for lithographic cluster LC, according to an embodiment. Calibration wafer 300 is streamed before a first lot 502 and a second lot 516. Alignment sensor AS measures alignment offsets of one or more alignment mark types 318 on calibration wafer 300, before processing first lot 502 to determine a correction set and calculate a weight correction in real time processing. A first weight correction can be applied to a correction set for processing first lot 502, which includes first lot wafers 504, immediately following calibration wafer 300 in the processing stream. By first streaming and measuring the alignment of alignment mark types 318 on calibration wafer 300, and then measuring the alignment of one or more alignment mark types of each wafer in the lot processing flow 500, alignment accuracy is improved through the use of a weight correction to each lot based on the calibrated alignment mark types 318 of calibration wafer 300, which in turn mitigates overlay drifts or jumps over time, thereby reducing LOH and improving productivity. A second weight correction, greater than or equal to the first weight correction applied to first lot 502, can be applied to a correction set for processing second lot 516, which includes second lot wafers 518, immediately following the first lot 502. The applied first and second weight corrections can each be any percentage in the range from about 0% to about 100% of the determined correction set. In some embodiments, the first and second weight corrections can each be about 15% to about 75% of the determined correction set. In some embodiments, a plurality of weight corrections can be applied to a plurality of lots. For example, first lot 502 following calibration wafer 300 can be processed by lithographic cluster LC applying 15% of the correction set, second lot 516 can be processed applying 30%, a successive third lot can be processed applying 45%, a successive fourth lot can be processed applying 60%, and a successive fifth lot can be processed applying 75%. In some embodiments, an overlay impact of each weight correction can be measured by lithographic apparatus LA, for example, inspection apparatus ME, in parallel with processing in order to validate that no overlay drifts or jumps have occurred. For example, the overlay impact can be checked offline with an external metrology tool (e.g., a standalone metrology tool) in parallel. In some embodiments, one or more alignment mark types 318 can be measured subsequent to process layer completion of first lot 502 in order to investigate any alignment offset change (e.g., position offset, mark type offset, diffraction order offset, wavelength offset, etc.).

As shown in FIG. 5, for example, lithographic cluster LC can operate in streaming mode 500 during lot operation (LO) mode, which includes automatic real time processing adjustments for each lot. In order to achieve optimal productivity and efficiency, lots need to be streamed (i.e., run in one train) in order to avoid time loss delays and LOH. The term "streaming," "streamed," "streaming mode," or "streamed lot operation (LO) mode" as used herein describes arranging or running one train of successive lots such that a succeeding lot starts before a preceding lot finishing, in order to avoid time loss delays and LOH. In some embodiments, streaming or streamed LO mode includes automatic real time processing adjustments for each lot to mitigate time loss delays and LOH. In some embodiments, streaming or streamed LO mode includes calibration streaming, for example, streaming calibration wafer 300, for each lot or for several subsequent lots to mitigate overlay drifts or jumps. The term "lot operation (LO) mode" as used herein describes automated processing of a lot (batch) of substrates. In some embodiments, LO mode includes automatic adjustments for each lot. In some embodiments, LO mode includes automatic wafer-to-wafer adjustments for each lot. In some embodiments, LO mode includes automatic substrate flow between a scanner unit, a track unit, a lithography apparatus, an alignment sensor, a metrology unit, or some combination thereof. The term "real time processing" as used herein describes hardware or software systems subject to a temporal constraint which guarantees response within a specified time. LOH reduction can be applied by operating lithographic cluster LC in streaming mode 500 and applying real time processing corrections to mitigate overlay drifts or jumps. In some embodiments, lithographic cluster LC can operate in LO mode which includes automatic wafer-to-wafer adjustments for each lot.

In some embodiments, lithographic apparatus LA and/or alignment sensor AS can be adjusted by lithographic apparatus control unit LACU and/or supervisory control system SCS on the basis of measured information by alignment sensor AS. For example, lithographic apparatus LA can be adjusted and calibrated based on measured alignment of alignment mark types 318 of calibration wafer 300, one or more alignment mark types (similar to alignment mark types 318) on wafers of first lot 502, one or more alignment mark types (similar to alignment mark types 318) on wafers of second lot 516, one or more alignment mark types on wafers of third or more successive lots (not shown in FIG. 5), or some combination thereof. In some embodiments, lithographic apparatus LA can expose first lot 502 while it corrects for errors made in a preceding finished lot. For example, lithographic apparatus LA can correct for overlay or offset errors made in a preceding finished lot by adjusting the alignment position in the correction set of first lot 502 and/or adjusting the alignment position in the correction set of a second lot 516 before exposure at the measurement station MEA. In some embodiments, lithographic apparatus control unit LACU and/or supervisory control system SCS of lithographic cluster LC can include or are operatively coupled to a memory storing an alignment offset, a correction set, a weight correction, an overlay impact module, a LOH reduction module, or some combination thereof. In some embodiments, lithographic apparatus control unit LACU and/or supervisory control system SCS of lithographic cluster LC can work in conjunction with alignment sensor AS to adjust the alignment offsets of alignment sensor AS and/or lithographic apparatus LA on the basis of a measured property, for example, alignment of one or more types of alignment mark types 318 on a patterned substrate, for example, calibration wafer 300.

As shown in FIG. 5, lithographic cluster LC can be configured to process, in series, at least first lot 502 having one or more wafers 504, and second lot 516 having one or more wafers 518. (Although only two lots 502 and 516 are illustrated in FIG. 5, lithographic cluster LC can process more than two lots in series.)

In some embodiments as shown in FIG. 5, the serial processing of first lot 502 and the immediately succeeding second lot 516 can be streamed—meaning that the processing start 512 of second lot 516 precedes the processing finish 510 of first lot 502. For example, lithographic cluster LC can start coating the first wafer 518 of second lot 516 before the last wafer 504 of first lot 502 is exposed. This streamed processing can be repeated for subsequently processed lots. Streaming increases throughput of lithographic cluster LC by reducing the LOH time period 530 between (a) the processing finish of the last wafer 504 of first lot 502 and (b) the processing start of the first wafer 518 of second lot 516.

First lot 502 includes first lot wafer process time 506 for each first lot wafer 504, which includes first lot inter wafer delay 508. Second lot 516 includes second lot wafer process time 520 for each second lot wafer 518, which includes second lot inter wafer delay 522, second lot wafer process start 524, and second lot wafer process finish 526. As shown in FIG. 5, second lot process time is defined as the time between first lot finish 510 and second lot finish 514. In some embodiments, first lot 502 or second lot 516 can each include a plurality of wafers 504, 518 (e.g., 5, 10, 15, 20, 25 wafers, etc.). For example, as shown in FIG. 5, second lot 516 can include five second lot wafers 518.

In some embodiments, lithographic cluster LC is configured to mitigate overlay drifts or jumps of the subsequently processed lots while also mitigating interruption to the process streaming flow of a plurality of lots being processed.

After calibration of one or more alignment mark types 318 of calibration wafer 300 by alignment sensor AS, alignment sensor AS and/or lithographic apparatus LA calculates and applies first weight correction to first lot 502 in real time processing to mitigate overlay drifts or jumps. First weight correction can be, for example, 15%, in some embodiments. Similarly, lithographic apparatus LA can calculate and apply second weight correction to second lot 516 in real time processing. Second weight correction can be, for example, 30%, in some embodiments.

In some embodiments, alignment sensor AS and/or lithographic apparatus LA can apply a plurality of weight corrections to a corresponding plurality of lots based on calibration of one or more alignment mark types 318 of calibration wafer 300 in real time processing. In some embodiments, after successive weight corrections have increased to a certain value or threshold (e.g., 75%, 80%, 85%, etc.), alignment sensor AS can measure and calibrate one or more alignment mark types 318 of a patterned substrate, for example, calibration wafer 300 or first lot 502, in order to compare the alignment offset magnitude and/or check for any overlay impact in parallel with inspection apparatus ME or an external metrology tool. In some embodiments, applying weight corrections to lots in real time processing based on calibrated alignment mark types 318 mitigates overlay drifts or jumps. For example, overlay drifts or jumps are reduced from 5 nm per month for BF marks 308. For example, overlay drifts or jumps are reduced from 0.5 nm per day.

Figure 6:
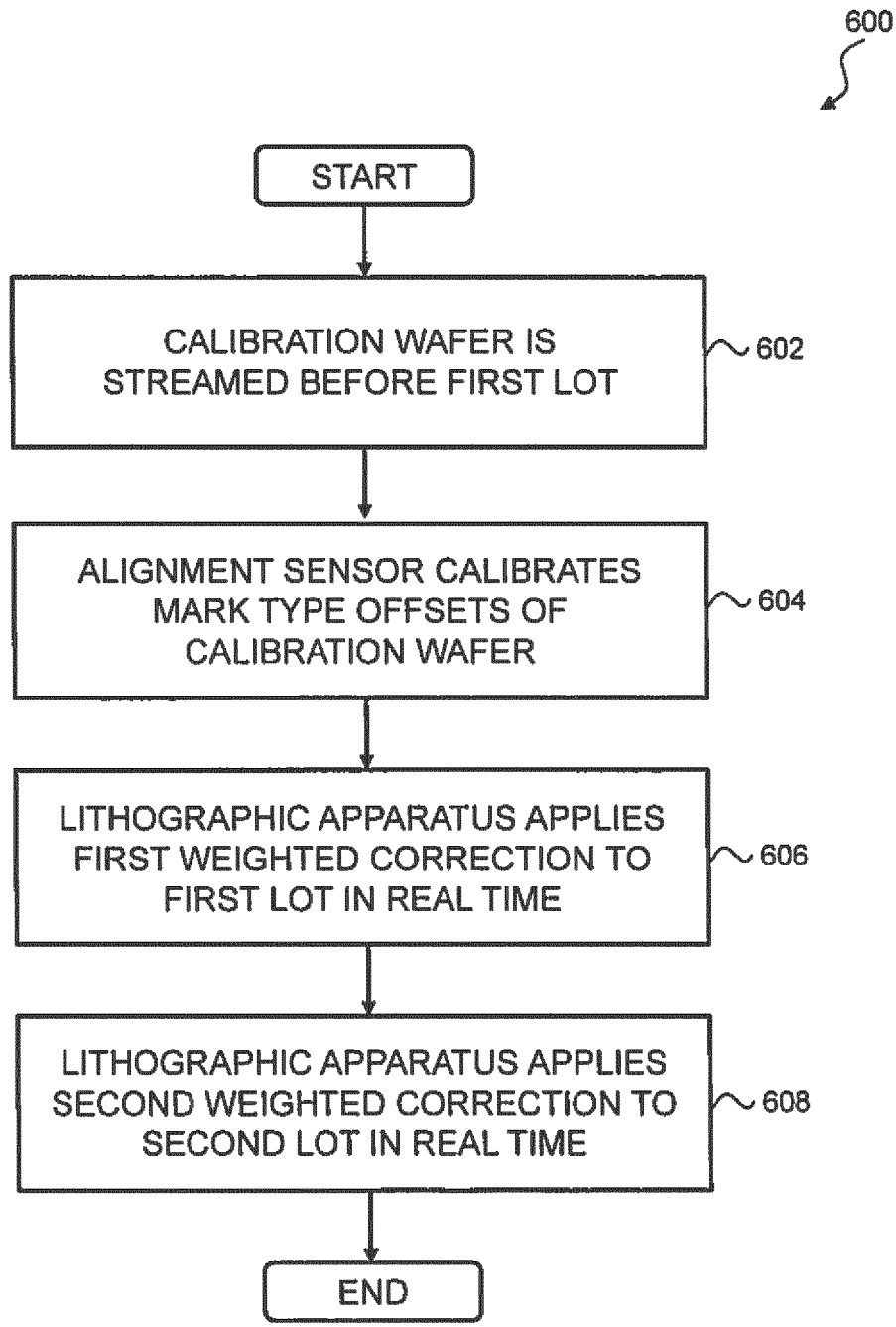
FIG. 6 depicts a flow diagram for mitigating overlay drifts or jumps, according to some embodiments.

FIG. 6 illustrates flow diagram of a method 600 for mitigating overlay drifts or jumps in lithographic cluster LC, according to an embodiment. It is to be appreciated that not all steps in FIG. 6 may be needed to perform the disclosure provided herein. Further, some of the steps may be performed simultaneously, or in a different order than shown in FIG. 6. Method 600 shall be described with reference to FIGS. 2 and 5. However, method 600 is not limited to those example embodiments.

At step 602, referencing FIGS. 2 and 5, calibration wafer 300 is streamed before first lot 502 in LO mode to process one or more lots. Track unit TU is operatively coupled to lithographic apparatus LA by supervisory control system SCS. Supervisory control system SCS, for example, via track control unit TCU and lithographic apparatus control unit LACU, controls an automatic substrate or lot flow between track unit TU and lithographic apparatus LA. Lithographic cluster CL operates on a feedforward control loop, in some embodiments, that includes automatic adjustments for each lot.

At step 604, referencing of FIGS. 2 and 5, alignment sensor AS calibrates mark type offsets of one or more types of alignment mark types 318 on calibration wafer 300. For example, alignment sensor AS measures and calibrates the alignment of one or more types of alignment mark types 318, for example BF marks 308 and SF marks 312, on calibration wafer 300. As shown in FIG. 5, for example, lithographic cluster LC can operate in streaming mode 500, which can include automatic real time processing adjustments for each lot. In some embodiments, alignment sensor AS can include a memory and a processor to store alignment measurements and calibrate mark type offsets to determine a correction set. In some embodiments, alignment sensor AS is connected to a memory and a processor of lithographic apparatus LA which stores alignment measurements of alignment sensor AS and calibrates mark type offsets to determine a correction set.

In some embodiments, alignment of one or more alignment mark types 318 of calibration wafer 300 can be measured by alignment sensor AS, and one or more controllers of lithographic cluster LC (e.g., one or more of controllers including supervisory control system SCS, lithographic apparatus control unit LACU, alignment sensor AS, and track control unit TCU) can determine a correction set that calibrates lithographic cluster LC based on the offset measurement of the one or more alignment mark types 318. The correction set can include one or more of the following data: a recipe, a layer, a mark type, a scan speed, a field layout, a plurality of mark locations, an aligned position, or some combination thereof. The correction set for each wafer is stored in a memory of lithographic cluster LC, for example, in a memory of alignment sensor AS and/or lithographic apparatus LA operatively coupled to controller LACU. Each correction set has a time stamp. If a certain number of correction sets is exceeded, the oldest stored correction set can be automatically deleted, for example, by an engineering data interface (EDI) utilizing an extensible markup language (XML) schema to move data from the device level in real time. In some embodiments, a user can delete correction sets manually.

At step 606, referencing FIGS. 2 and 5, lithographic apparatus LA applies, in real time, a first weight correction to the correction set determined at step 604 for first lot 502 following calibration wafer 300 in the process stream 500. Lithographic apparatus LA uses calibrated alignment mark types 318 from alignment sensor AS to calculate first weight correction to mitigate overlay drifts or jumps. In some embodiments, first weight correction applied to first lot 502 is about 0% to 100% of at least one parameter of the correction set determined at step 604. In some embodiments, first weight correction is about 15% to 75% of at least one parameter of the correction set determined at step 604.

After determining the correction set based on the measured alignment or alignment offset (e.g., position offset, mark type offset, diffraction order offset, wavelength offset, etc.) of one or more alignment mark types 318 of calibration wafer 300 by alignment sensor AS, a calibrated alignment offset is stored in a memory of alignment sensor AS and/or lithographic apparatus LA, for example, in a memory of or operatively coupled to the lithographic apparatus control unit LACU. In some embodiments, first weight correction is then applied by lithographic cluster LC (e.g., by supervisory control system SCS, lithographic apparatus control unit LACU, alignment sensor AS, and/or lithographic apparatus LA) to one or more parameters of the correction set. For example, first weight correction can be applied to the aligned position of a first lot wafer 504. In some embodiments, each weight correction can be executed through in-situ monitoring and/or a feedback/feedforward loop(s), for example, an application specific correction (ASC), a dynamic application specific correction (ASC2), an application process correction (APC), an internal APC loop (iAPC), or some combination thereof. ASC, ASC2, APC, and iAPC are different monitoring and feedback systems and methods that improve process or specific corrections, for example, a weight corrected alignment position offset. For example, APC can trigger substrate positioner PW to compensate for a correction set parameter if that parameter is determined to be outside of a predetermined tolerance. In some embodiments, as shown in FIG. 5, first weight correction can be applied to the correction set for processing first lot 502, which includes first lot wafers 504, immediately following calibration wafer 300 in the processing stream, to mitigate overlay drifts or jumps. For example, first weight correction can be applied to a calibrated alignment offset.

At step 608, referencing FIGS. 2 and 5, lithographic apparatus LA applies, in real time, a second weight correction to the correction set determined at step 604 while processing second lot 516 immediately following first lot 502 in the process stream 500. Lithographic apparatus LA uses calibrated alignment mark types 318 to calculate second weight correction to mitigate overlay drifts or jumps. Second weight correction is about 0% to 100%. In some embodiments, second weight correction is about 15% to 75% of at least one parameter of the correction set determined at step 604.

In some embodiments, second weight correction, greater than or equal to first weight correction applied to first lot 502, can be applied to the correction set for processing second lot 516, which includes second lot wafers 518, immediately following first lot 502. In some embodiments, the applied first and second weight corrections can be any percentage in the range from about 0% to about 100% of the determined correction set. In some embodiments, the first and second weight corrections can be about 15% to about 75% of the determined correction set. In some embodiments, a plurality of weight corrections can be applied to a plurality of lots. For example, first lot 502 following calibration wafer 300 can be processed by lithographic cluster LC applying 15% of the correction set, second lot 516 can be processed applying 30%, a successive third lot can be processed applying 45%, a successive fourth lot can be processed applying 60%, and a successive fifth lot can be processed applying 75%.

After successive weight corrections have increased to a certain value or threshold (e.g., 75%, 80%, 85%, etc.), alignment sensor AS can measure the alignment of a patterned substrate, for example, an alignment mark type 318 on calibration wafer 300 (e.g., the same calibration wafer 300 used at Step 604 or a different calibration wafer 300), and alignment mark types 318 on subsequently processed lots, in order to compare the alignment offset magnitude and/or check for any overlay impact in parallel. In some embodiments, an overlay impact of each weight correction can be measured by lithographic apparatus LA, for example, inspection apparatus ME, or by an external metrology tool, in parallel with processing in order to validate that no overlay drifts or jumps have occurred. In some embodiments, an alignment mark type 318 is measured on each wafer of each successive lot in a dynamic mode, such that the correction set can be updated based on dynamic measurements, for example, an average offset of alignment position for a particular alignment mark type 318. For example, a weight correction can be applied to the correction set based on the dynamic measurements of the alignment mark type 318 for each lot.

The embodiments may further be described using the following clauses:

1. A lithographic cluster comprising:
    a track unit configured to process a first lot comprising a first plurality of wafers and a second lot comprising a second plurality of wafers, and
    a lithographic apparatus operatively coupled to the track unit, comprising:
        an alignment sensor configured to measure an alignment of at least one alignment mark type of a calibration wafer; and
        at least one controller configured to:
            determine a correction set for calibrating the lithographic apparatus based on the measured alignment of the at least one alignment mark type,
            apply a first weight correction to the correction set for processing the first lot, and
            apply a second weight correction to the correction set for processing the second lot, the second weight correction being greater than or equal to the first weight correction such that overlay drifts or jumps during processing the first and second lots are mitigated.

2. The lithographic cluster of clause 1, wherein the track unit is further configured to stream and process the calibration wafer.

3. The lithographic cluster of clause 1, wherein the calibration wafer is an etched and non-coated wafer.

4. The lithographic cluster of clause 1, wherein the calibration wafer is coated.

5. The lithographic cluster of clause 1, wherein the track unit and the lithographic apparatus are configured to stream the first lot and the second lot such that a start time for processing the second lot occurs before a finish time for processing the first lot.

6. The lithographic cluster of clause 1, wherein the alignment sensor measures the alignment of the at least one alignment mark type of the calibration wafer while the calibration wafer is streamed before the first lot and the second lot.

7. The lithographic cluster of clause 1, wherein the at least one alignment mark type of the calibration wafer comprises a bidirectional fine wafer alignment (BF) mark.

8. The lithographic cluster of clause 1, wherein the at least one alignment mark type of the calibration wafer comprises a symmetrical fine wafer alignment (SF) mark.

9. The lithographic cluster of clause 1, wherein applying the first weight correction and applying the second weight correction each comprises implementing an application specific correction (ASC), dynamic application specific correction (ASC2), application process correction (APC), internal APC loop, or some combination thereof.

10. A method for mitigating overlay drifts or jumps in a lithographic cluster, comprising:
   measuring, using an alignment sensor, an alignment of at least one alignment mark type of a calibration wafer;
   determining, using at least one controller, a correction set based on the measured alignment of the at least one alignment mark type; and
   processing, using a lithographic apparatus, a first lot comprising a first plurality of wafers by applying a first weight correction to the correction set, and a second lot comprising a second plurality of wafers by applying a second weight correction to the correction set.

11. The method of clause 10, wherein the processing comprises streaming the first lot and the second lot such that a start time of the second lot occurs before a finish time of the first lot.

12. The method of clause 10, wherein the processing occurs in real time.

13. The method of clause 10, further comprising streaming the calibration wafer before the first lot and the second lot, such that a start time of processing the first lot occurs after the correction set based on the measured alignment of the calibration wafer is determined.

14. The method of clause 10, wherein the at least one alignment mark type of the calibration wafer comprises a bidirectional fine wafer alignment (BF) mark, a symmetrical fine wafer alignment (SF) mark, a custom mark, or some combination thereof.

15. The method of clause 10, wherein the second weight correction is equal to or greater than the first weight correction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A lithographic cluster comprising:
   a track unit configured to process a first lot comprising a first plurality of wafers and a second lot comprising a second plurality of wafers, and
   a lithographic apparatus operatively coupled to the track unit, comprising:
      an alignment sensor configured to measure an alignment of at least one alignment mark type of a calibration wafer; and
      at least one controller configured to:
         determine a correction set configured to calibrate the lithographic apparatus based on the measured alignment of the at least one alignment mark type,
         apply a first weight correction to the correction set for processing the first lot, and
         apply a second weight correction to the correction set for processing the second lot, the second weight correction being greater than or equal to the first weight correction, such that overlay drifts or jumps during processing the first and second lots are mitigated.

2. The lithographic cluster of claim 1, wherein the track unit is further configured to stream and process the calibration wafer.

3. The lithographic cluster of claim 1, wherein the calibration wafer comprises an etched and non-coated wafer.

4. The lithographic cluster of claim 1, wherein the calibration wafer is coated.

5. The lithographic cluster of claim 1, wherein the track unit and the lithographic apparatus are configured to stream the first lot and the second lot, such that a start time for processing the second lot occurs before a finish time for processing the first lot.

6. The lithographic cluster of claim 1, wherein the alignment sensor measures the alignment of the at least one alignment mark type of the calibration wafer while the calibration wafer is streamed before the first lot and the second lot.

7. The lithographic cluster of claim 1, wherein the at least one alignment mark type of the calibration wafer comprises a bidirectional fine wafer alignment (BF) mark.

8. The lithographic cluster of claim 1, wherein the at least one alignment mark type of the calibration wafer comprises a symmetrical fine wafer alignment (SF) mark.

9. The lithographic cluster of claim 1, wherein the apply the first weight correction and the apply the second weight correction each comprises implementing an application specific correction (ASC), dynamic application specific correction (ASC2), application process correction (APC), internal APC loop, or some combination thereof.

10. A method comprising:
    measuring, using an alignment sensor, an alignment of at least one alignment mark type of a calibration wafer;
    determining, using at least one controller, a correction set based on the measured alignment of the at least one alignment mark type; and
    processing, using a lithographic apparatus, a first lot comprising a first plurality of wafers by applying a first weight correction to the correction set, and a second lot comprising a second plurality of wafers by applying a second weight correction to the correction set.

11. The method of claim 10, wherein the processing comprises streaming the first lot and the second lot such that a start time of the second lot occurs before a finish time of the first lot.

12. The method of claim 10, wherein the processing occurs in real time.

13. The method of claim 10, further comprising streaming the calibration wafer before the first lot and the second lot, such that a start time of processing the first lot occurs after the correction set based on the measured alignment of the calibration wafer is determined.

14. The method of claim 10, wherein the at least one alignment mark type of the calibration wafer comprises a bidirectional fine wafer alignment (BF) mark, a symmetrical fine wafer alignment (SF) mark, a custom mark, or some combination thereof.

15. The method of claim 10, wherein the second weight correction is equal to or greater than the first weight correction.

* * * * *